United States Patent [19]

Kawano et al.

[11] Patent Number: 5,781,560
[45] Date of Patent: Jul. 14, 1998

[54] SYSTEM TESTING DEVICE AND METHOD USING JTAG CIRCUIT FOR TESTING HIGH-PACKAGE DENSITY PRINTED CIRCUIT BOARDS

[75] Inventors: Kayoko Kawano; Yasushi Takaki. both of Kawasaki; Shinichi Sutou. Yokohama; Kazuhiro Hara. Kiso-mura. all of Japan

[73] Assignee: Fujitsu Limited. Kawasaki. Japan

[21] Appl. No.: 902,950

[22] Filed: Jul. 30, 1997

Related U.S. Application Data

[63] Continuation of Ser. No. 395,973, Feb. 28, 1995, abandoned.

[30] Foreign Application Priority Data

Mar. 17, 1994 [JP] Japan ................................. 6-046706

[51] Int. Cl.$^6$ .......................................... G01R 31/28
[52] U.S. Cl. .......................................... 371/22.32
[58] Field of Search ........................ 371/22.32, 15.1, 371/22.1; 324/73.1; 326/16

[56] References Cited

U.S. PATENT DOCUMENTS

| | | | |
|---|---|---|---|
| 4,897,837 | 1/1990 | Ishihara et al. | 371/22.3 |
| 5,115,435 | 5/1992 | Langford et al. | 371/22.3 |
| 5,329,471 | 7/1994 | Swoboda et al. | 364/578 |
| 5,343,478 | 8/1994 | James et al. | 371/22.3 |
| 5,355,369 | 10/1994 | Greenbergerl et al. | 371/22.3 |
| 5,400,345 | 3/1995 | Ryan, Jr. | 371/22.3 |
| 5,416,409 | 5/1995 | Hunter | 324/158.1 |
| 5,450,415 | 9/1995 | Kamada | 371/22.3 |
| 5,452,419 | 9/1995 | DiGiulio et al. | 395/200.01 |

FOREIGN PATENT DOCUMENTS

| | | | |
|---|---|---|---|
| 559 209 | 9/1993 | European Pat. Off. | G01R 31/28 |
| 565 866 | 10/1993 | European Pat. Off. | G01R 31/3187 |
| 570 067 | 11/1993 | European Pat. Off. | G01R 31/3187 |
| 2 267 767 | 12/1993 | United Kingdom | G06F 9/445 |

OTHER PUBLICATIONS

IEEE STD 1149. Jan. 1990. "IEEE Standard Test Access Port and Boundary-Scan Architecture", pp. 1-1. 1990.

Primary Examiner—Robert W. Beausoliel. Jr.
Assistant Examiner—Stephen C. Elmore
Attorney, Agent, or Firm—Staas & Halsey

[57] ABSTRACT

A method and system testing device for testing a printed circuit board includes a JTAG circuit provided with a JTAG instruction storage unit for storing a command to control a system logic circuit; and a JTAG data storage unit for storing data used to control the system logic circuit. The system testing device tests the system logic circuit in an LSI by selectively inputting/outputting data to a boundary scan register, a bypass register, the JTAG instruction storage unit, and the JTAG data storage unit.

13 Claims, 10 Drawing Sheets

FIG. 10

```
       ⎧ S201  TEST-LOGIC-RESET
       ⎪      RUN-TEST/IDLE
       ⎪      SELECT-DR-SCAN
       ⎪      SELECT-IR-SCAN    ⎫
       ⎪ S205 CAPTURE-IR        ⎪
       ⎪      SHIFT-IR           ⎪  IR SET
       ⎪      EXIT1-IR           ⎬  SET "JIR SET"
       ⎪      PAUSE-IR           ⎪  IN INSTRUCTION REGISTER
       ⎪      EXIT2-IR           ⎪
       ⎪ S210 SHIFT-IR           ⎪
       ⎪      EXIT1-IR           ⎪
       ⎪      UPDATE-IR         ⎭
       ⎪      RUN-TEST/IDLE
       ⎪      SELECT-DR-SCAN    ⎫
       ⎪ S215 CAPTURE-DR         ⎪
       ⎪      SHIFT-DR           ⎪  JIR SET
       ⎪      EXIT1-DR           ⎬  SET COMMAND IN JIR WHICH
       ⎪      PAUSE-DR           ⎪  IS ONE OF DATA REGISTERS
       ⎪      EXIT2-DR           ⎪
       ⎪ S220 SHIFT-DR           ⎪
       ⎪      EXIT1-DR           ⎪
       ⎨      UPDATE-DR         ⎭
       ⎪      RUN-TEST/IDLE
       ⎪      SELECT-DR-SCAN
       ⎪ S225 SELECT-IR-SCAN    ⎫
       ⎪      CAPTURE-IR         ⎪
       ⎪      SHIFT-IR           ⎪  IR SET
       ⎪      EXIT1-IR           ⎬  SET "JDR SET"
       ⎪      PAUSE-IR           ⎪  IN INSTRUCTION REGISTER
       ⎪ S230 EXIT2-IR           ⎪
       ⎪      SHIFT-IR           ⎪
       ⎪      EXIT1-IR           ⎪
       ⎪      UPDATE-IR         ⎭
       ⎪      RUN-TEST/IDLE
       ⎪ S235 SELECT-DR-SCAN    ⎫
       ⎪      CAPTURE-DR         ⎪
       ⎪      SHIFT-DR           ⎪  JDR SET
       ⎪      EXIT1-DR           ⎬  SET DATA IN JDR WHICH
       ⎪      PAUSE-DR           ⎪  IS ONE OF DATA REGISTERS
       ⎪ S240 EXIT2-DR           ⎪
       ⎪      SHIFT-DR           ⎪
       ⎪      EXIT1-DR           ⎪
       ⎪      UPDATE-DR         ⎭
       ⎪      RUN-TEST/IDLE
       ⎪ S245 SELECT-DR-SCAN
       ⎪      SELECT-IR-SCAN
       ⎩      TEST-LOGIC-RESET
```

SYSTEM TESTING DEVICE AND METHOD USING JTAG CIRCUIT FOR TESTING HIGH-PACKAGE DENSITY PRINTED CIRCUIT BOARDS

This application is a continuation, of application Ser. No. 08/395,973, filed Feb. 28, 1995, now abandoned.

BACKGROUND OF THE INVENTION

1. Field of the Invention

The present invention relates to a system testing device and method using a JTAG circuit for use in testing a high-package-density printed circuit board.

2. Description of the Related Art

Large scale integrated circuit (LSI) has been widely adopted lately, and more complicated circuits have successfully been mounted to a smaller chip-size LSI unit. Additionally, improved surface packaging technologies of printed circuit boards have enabled a larger number of chips to be mounted on printed circuit boards. As a result, small-sized high performance systems can be easily introduced, while it becomes more difficult to conduct a proper test on each LSI on a printed circuit board.

A test mechanism to be incorporated into the LSI is defined in the board test method of the IEEE Standard 1149.1 introduced by the Joint Test Action Group (hereinafter referred to as JTAG for short). Described below is the boundary scan architecture (hereinafter referred to as a JTAG circuit for short) proposed by the JTAG.

FIG. 1 shows the configuration of the conventional JTAG circuit. The JTAG circuit comprises as the smallest configuration a test access port (hereinafter referred to as a TAP for short), a TAP controller 107, a scannable instruction register 104, a series of scannable boundary scan register 101 and bypass register 102, multiplexers 105 and 106 for selecting data output from the registers and outputting them, and a data register selector 103 for selecting either the boundary scan register 101 or the bypass register 102.

A TAP signal can be entered by a test clock input (TCK), a test mode selection input (TMS), a test data input (TDI), a test data output (TDO), and a test reset input (TRST) to initialize a test logic.

The logic of a JTAG circuit in an LSI is defined as a test logic, and the logic of a circuit other than the JTAG circuit in the LSI is defined as a system logic.

The boundary scan register 101 is mounted with a stage of shift register connected to each terminal of a test LSI to capture and store a signal reaching the terminal of the LSI on the principle of a scan test.

The bypass register 102 comprises a stage of shift register and enables an input from the test data input TDI to be bypassed to the test data output TDO. Accordingly, the bypass register 102 is used when data are bypassed from a JTAG circuit to another JTAG circuit.

The TAP controller 107 shifts data to the instruction register 104, the boundary scan register 101, or the bypass register 102 using the test mode selection input TMS and test clock input TCK. The data written to the instruction register 104 are input to the data register selector 103 to select either the boundary scan register 101 or the bypass register 102 and perform a boundary scanning operation or a bypassing operation. Then, output is an output signal of a register selected by the multiplexer 1 105 (MUX 1). The multiplexer 2 106 (MUX 2) selects and outputs an output signal from the instruction register 104, boundary scan register 101, or bypass register 102.

FIG. 2 shows the state transition of a test logic. The state transition of the test logic is controlled by the TAP controller 107 to realize various test states. The TAP controller 107 is controlled by the test mode selection input TMS, test clock input TCK, and test reset input TRST in the test access port TAP.

A TEST-LOGIC-RESET state (S101) is entered immediately after the TAP controller 107 has been initialized. In this state, a test logic is not applicable and a system logic can be normally operated.

A state is shifted to another state according to the state of the test mode selection input TMS at the rise of the test clock input TCK. For example, if the test clock input TCK rises in the TEST-LOGIC-RESET state (S101) and the test mode selection input TMS is 0, then the state is shifted to a RUN-TEST/IDLE state (S102). If the test mode selection input TMS is 1, then the TEST-LOGIC-RESET state (S101) remains unchanged.

The RUN-TEST/IDLE state (S102) is a basic state of a test in process, and indicates the start of a scanning operation or the intermediate state of the scanning operation.

If the state is shifted to a SELECT-DR-SCAN state (S103), then the scanning sequence is initialized.

According to the state of the test mode selection input TMS, entered is a CAPTURE-DR state (S111) or a SELECT-IR-SCAN state (S104). Described below is the transition to the SELECT-IR-SCAN state (S104). If the SELECT-IR-SCAN state (S104) is entered, the scanning sequence of the instruction register 104 is initialized.

If the state is shifted to a CAPTURE-IR state (S105), then a fixed pattern is fetched to a shift register in the instruction register 104. The fixed pattern is the 2 lowest bits set to a binary code 01, and can contain specific designing information. The contents of the instruction register 104 can be read through the test data output TDO while the shifting operation is being performed.

If the state is shifted to a SHIFT-IR state (S106), then the shift register in the instruction register 104 is connected to the test data input TDI and the test data output TDO. Each time the test clock input TCK rises when the test mode selection input TMS is 0, then data are shifted to the test data output TDO. If the instruction register 104 is an 8 bit register, a predetermined instruction can be written to the instruction register 104 by repeating the shifting operations 8 times. The contents of the instruction register 104 can be read by reading the test data output TDO while repeating the shifting operations.

When the shifting operation is to be terminated, the state is shifted to an EXIT1-IR state (S107). This state is then shifted to a state of either terminating a scanning operation or suspending a shifting operation of the instruction register 104. The state is shifted to a PAUSE-IR state (S108) if the test mode selection input TMS is set to 0 and the test clock input TCK rises. If the test mode selection input TMS is set to 1 and the test clock input TCK is initialized, then the state is shifted to an UPDATE-IR state (S110).

If the state is shifted to the PAUSE-IR state (S108), then suspended is the shifting operation of the instruction register 104 in the serial path between the test data input TDI and the test data output TDO. This state is utilized when a new pattern is loaded from the external storage unit to a memory in the test mechanism.

If the test mode selection input TMS is set to 1 and the test clock input TCK rises, then the state is shifted to an EXIT2-IR state (S109). When the scanning operation is required, the state is shifted to the SHIFT-IR state (S106) to perform the shifting operation. When the scanning operation is to be terminated, the state is shifted to the UPDATE-IR state (S110).

If the state is shifted to the UPDATE-IR state (S110), a new instruction shifted to the shift register is latched and output in parallel. When the latch is completed, the instruction is followed. For example, when a bypass instruction is loaded in the instruction register 104, then the bypass register 102 is selected and a bypassing operation is performed through the shift by the bypass register 102.

S103 and S111–S116 shown in the figure of the state transitions show the scanning operations in the boundary scan register 101 or the bypass register 102. Compared with the scanning operation in the instruction register 104, object registers are the boundary scan register 101 or the bypass register 102 and the number of the shifts of the scanning operations depends on the selection of the boundary scan register 101 or the bypass register 102. However, the scanning operations of these registers are generally similar, and therefore the detailed explanation of the operation of the boundary scan register 101 or the bypass register 102 is omitted here.

FIG. 3 shows the general configuration in checking the body of the conventional device. A service processor 201 (SVP) is connected to an interface circuit 202 (SCI) and issues a control command to control the registers of each of printed circuit boards 203-1–203-m, write data to a memory, read data from the memory, etc. The service processor 201 also controls the JTAG circuit in each printed circuit board. The SCI 202 and each printed circuit board in the body of the device are connected through a test access port TAP for controlling the JTAG circuit and a command bus for transmitting the control command and control data, etc.

The test data output TDO of the JTAG circuit in the LSI mounted to each printed circuit board is connected to the test data input TDI of the JTAG circuit in another LSI of the same printed circuit board (not shown in the attached drawings). Thus formed is a large scan chain connecting each LSI on a printed circuit board, and all LSIs on the printed circuit board can be tested by controlling the 5 TAP signals from the interface circuit SCI 202.

In the procedure of testing each printed circuit board of the body of the device, the SVP 201 first issues to each printed circuit board a command to set a register, a memory, etc. in the LSI mounted to the printed circuit board through the command bus. A command control unit in the LSI (not shown in the attached drawings) analyzes a command, executes it by referring to the data transmitted from the SVP 201, and sets circuits of, for example, the registers in the LSI to operate the circuits.

Then, the JTAG circuit is controlled according to the above described state transition, and the boundary scan register 101 is selected for an LSI to be tested. The bypass register 102 is selected for an LSI not to be tested. Then, the state of each circuit in the LSI can be scanned through a scanning operation.

Furthermore, the state of a register in an LSI or the data in a memory can also be obtained by reading data via the command bus during the test.

In the conventional test devices, the connections between the SCI 202 and each of the printed circuit boards 203-1–203-m requires the connection of the test access port TAP and the command bus for each printed circuit board, and therefore greatly increases the number of connection lines as the number of printed circuit board increases.

The SCI 202 also requires a JTAG scanning interface circuit for controlling the JTAG circuit and a command interface circuit for issuing a command. Therefore, the SCI 202 must be equipped with the JTAG scanning interface circuit and the command interface circuit for each printed circuit board to be tested, and the circuit scale of the SCI 202 possibly becomes very large each time the number of printed circuit boards to be tested increases.

Summary of the Invention

The present invention aims at using a JTAG circuit to reduce the scale of the circuit of a test device and the number of connection lines used to connect a test device to a printed circuit board to be tested when a high package-density printed circuit board is tested.

The present invention comprises a JTAG circuit comprising as data registers a boundary scan register, a bypass register, a JTAG instruction storage unit for storing a command to control a system logic circuit, and a JTAG data storage unit for storing data used to control the system logic circuit; a command analyzing unit for analyzing a command output by the JTAG instruction storage unit; and an executing unit for performing a process according to the analysis result from the command analyzing unit.

BRIEF DESCRIPTION OF THE DRAWINGS

FIG. 10 shows state transitions detected when a command and data are set in the JIR and JDR respectively of FIG. 8 according to the present invention.

DETAILED DESCRIPTION OF THE PREFERRED EMBODIMENTS

Figure 4:
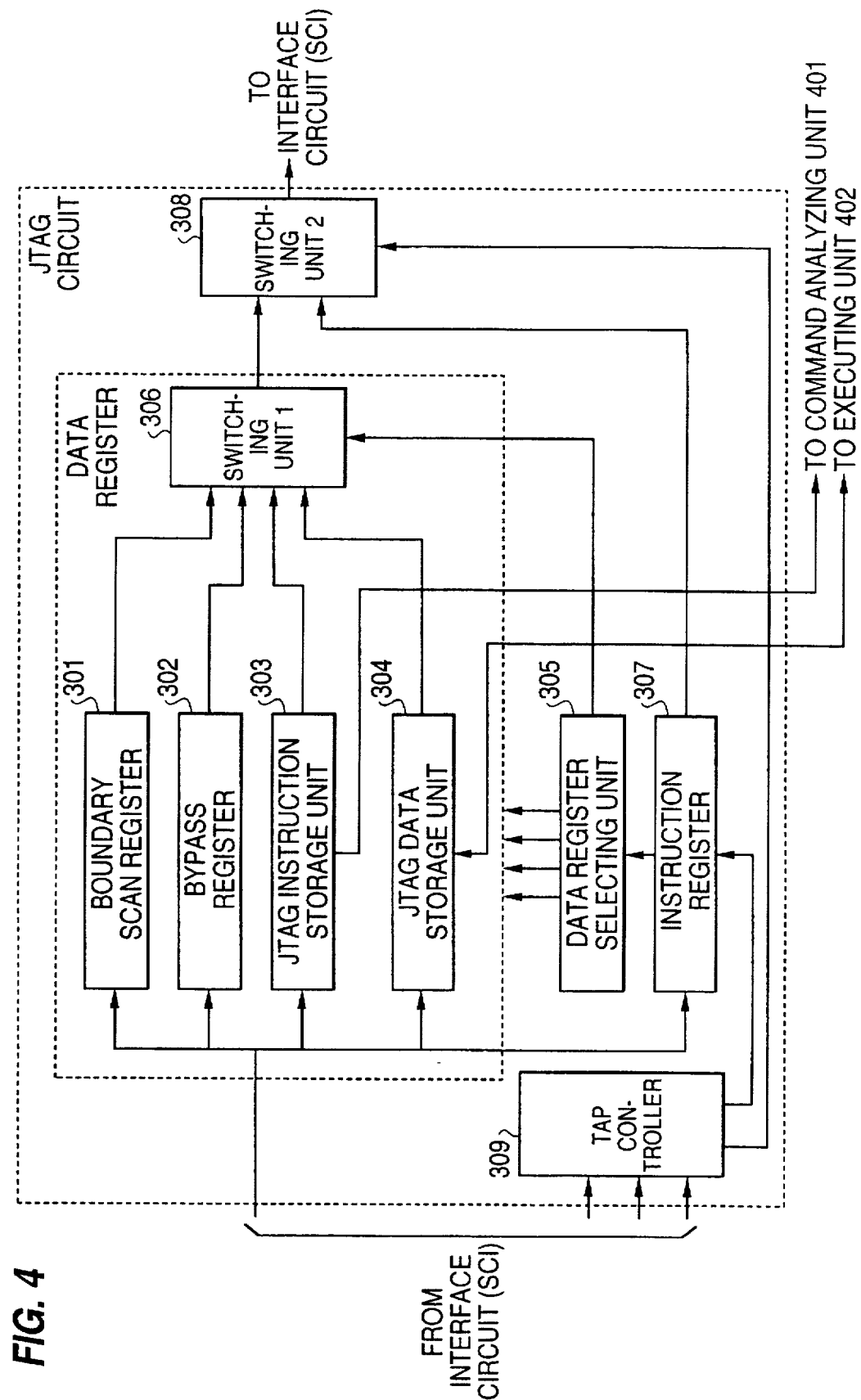
FIG. 4 is a block diagram showing the principle of the present invention.
Figure 5:
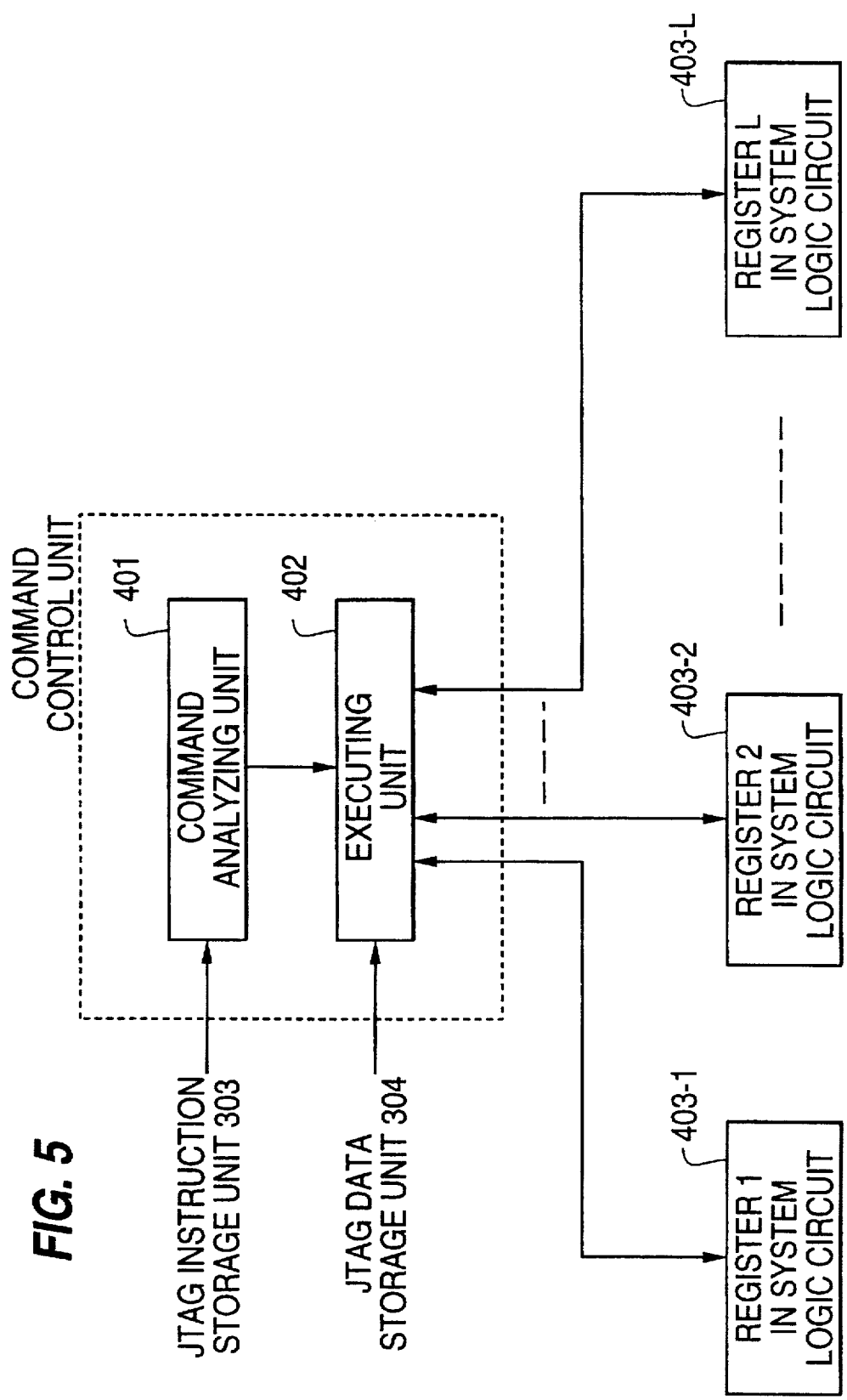
FIG. 5 is a block diagram showing the principle of the present invention.

FIGS. 4 and 5 are block diagrams showing the principle of the present invention.

A data register comprises a boundary scan register 301 for capturing and storing a signal reaching each terminal of an LSI to be tested, a bypass register 302 for bypassing a signal to another LSI, a JTAG instruction storage unit 303 for storing a command to control a system logic circuit, and a JTAG data storage unit 304 for storing data to control the system logic circuit. In an embodiment of the present invention, each data register comprises a shift register, or a shift register and a latch circuit. The JTAG instruction storage unit 303 is explained as a JTAG instruction register and the JTAG data storage unit 304 is explained as a JTAG data register.

A data register selecting unit 305 selects one register from the above described data registers, comprises a decoder circuit, and is explained as a data register selector in an embodiment of the present invention.

A switching unit 1 306 switches each output of the data register according to an instruction of the data register selecting unit 305, comprises a multiplexer, and is explained as an MUX 3 in an embodiment of the present invention.

An instruction register 307 shifts and latches serial data, and outputs them to the data register selecting unit 305 as parallel data, and comprises a shift register, or a shift register and a latch circuit.

A switching unit 2 308 switches outputs between the switching unit 1 306 and the instruction register 307, comprises a multiplexer, and is explained as an MUX 4 in an embodiment of the present invention.

A TAP controller 309 controls the data register, the data register selecting unit 305, the switching unit 1 306, the instruction register 307, and the switching unit 2 308.

A command analyzing unit 401 analyzes the contents of a command output by the JTAG instruction storage unit 303.

An executing unit 402 performs a process according to an analysis result obtained by the command analyzing unit 401.

The principle of the operations of the present invention is explained by referring to FIGS. 4 and 5.

The TAP controller 309 is controlled according to a signal from the interface circuit (SCI). The TAP controller 309 selects a register, storage unit, and instruction register, and shifts and latches data for the selected registers or storage units.

If the TAP controller 309 selects the instruction register 307, then an instruction is shifted and latched in the instruction register 307 through a shifting operation, and then transferred to the data register selecting unit 305. The data register selecting unit 305 selects one data register according to the transferred instruction, and the data register shifting operation is performed for the selected register or the storage unit.

If the TAP controller 309 selects the boundary scan register 301, then a signal of each terminal of an LSI is latched and shifted in the boundary scan register 301, thereby enabling the signal of each terminal to be scanned.

If the TAP controller 309 selects the bypass register 302, then input data are output as output data directly, thereby enabling the data signal to be bypassed to an external unit.

If the TAP controller 309 selects the JTAG instruction storage unit 303, a command is written to the JTAG instruction storage unit 303 through a shifting operation, and the written command is transferred to the command analyzing unit 401 in the command control unit. The command analyzing unit 401 analyzes the transferred command and transfers the analysis result to the executing unit 402.

If the command requests a write to registers 403-1–403-L in a system logic circuit, then the TAP controller 309 selects the JTAG data storage unit 304 by the TAP controller 309, and data are written to the JTAG data storage unit 304 through a shifting operation. The written data are transferred to the executing unit 402 in the command control unit. The transferred data are written to a predetermined register in a system logic circuit according to the analysis result.

If the command requests a read of data from the registers 403-1–403-L in the system logic circuit, then the executing unit 402 transfers the data from the register in the system logic circuit to the JTAG data storage unit 304. The TAP controller 309 shifts and reads the data in the JTAG data storage unit 304, thereby reading the state of the register in the system logic circuit.

The switching unit 1 306 selects and outputs an output of a register or a storage unit selected in a data register when the data register performs a shifting operation.

When the switching unit 2 308 performs a shifting operation, it selects and outputs an output of either a data register or an instruction register.

Figure 6:
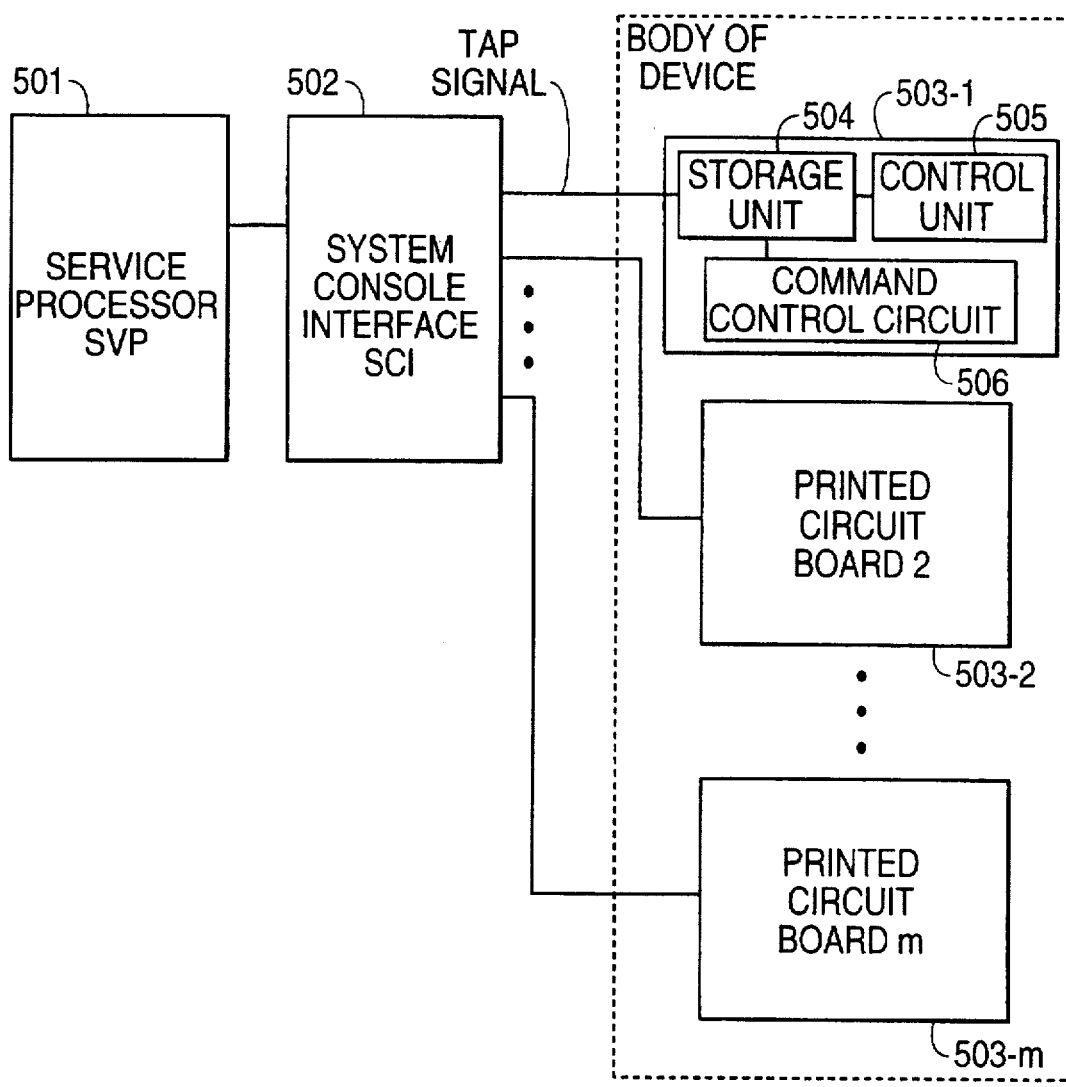
FIG. 6 shows the general configuration of an embodiment of the present invention.

FIG. 6 is a block diagram showing the principle of the present invention and the general configuration of an embodiment of the present invention. A service processor 501 (SVP) is connected to an interface circuit 502 (SCI) and controls the JTAG circuit on each printed circuit board of the body of the device. The SCI 502 is connected to each of printed circuit boards 503-1–503-m in the body of the device through only 5 test access ports TAP (test clock input TCK, test mode selection input TMS, test data input TDI, test data output TDO, and test reset input TRST). An instruction from the SVP 501 is received at the SCI 502, and output after converting into a TAP signal, that is, a signal for use in controlling the JTAG circuit in the SCI 502.

The printed circuit boards 1–m in the body of the device are equipped with LSIs, and the LSIs contain test circuits for the LSIs. The test circuit comprises a storage unit 504, a control unit 505, and a command control circuit 506. The control unit 505 controls the input of a command transferred according to a TAP signal from the SCI 502, and stores the command in a storage unit 504. When the control unit 505 finishes storing the command in the storage unit 504, it transfers the command to a command control circuit 506. The command control circuit 506 analyzes the received command, controls a system logic circuit in the LSI, and performs an operation specified by the command.

Figure 7:
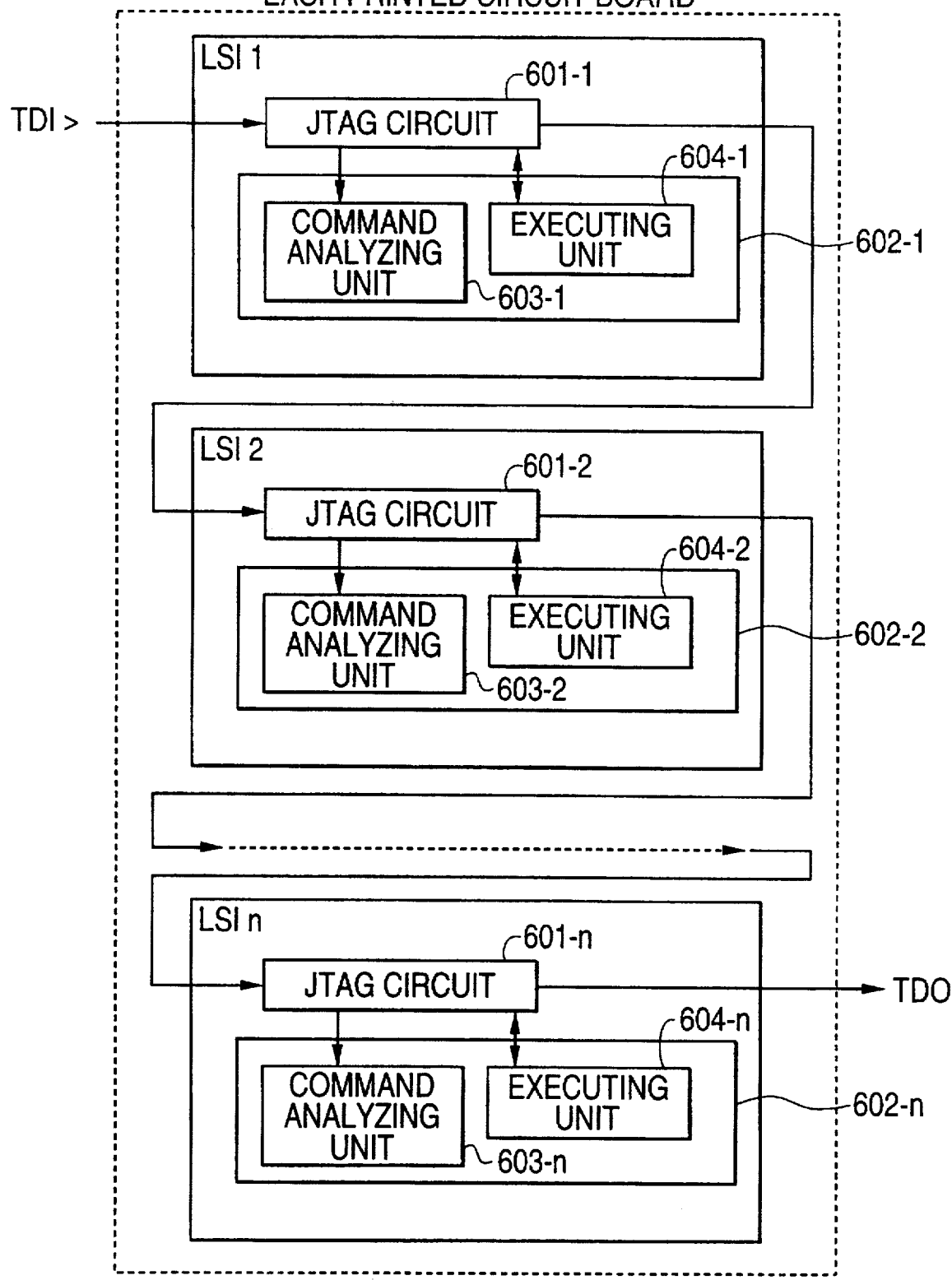
FIG. 7 shows the connection between respective LSI at each printed circuit board of the embodiment shown in FIG. 6 according to the present invention.

FIG. 7 shows the connection of an LSI on each printed circuit board. LSI 1–LSI n are equipped with system logic circuits for performing an operation of a normal system logic and circuits for test use only. Each LSI equipped on the printed circuit board shown in FIG. 7 has only the circuits for test use only, that is, JTAG circuits 601-1–601-n and command control units 602-1–602-n for analyzing and executing commands. System logic circuits for performing normal operations are omitted.

Command control units 602-1–602-n comprise command analyzing units 603-1–603-n for analyzing a command transferred from the JTAG circuit and executing units 604-1–604-n for performing a process according to the analysis result of the command analyzing units 603-1–603-n. During the test, the executing units 604-1–604-n directly set data in the register of a system logic circuit for performing a normal operation and directly read data from the register, thereby setting in the register those data that cannot be set in a normal operation of the system or reading data in a circuit which cannot be read in a normal operation. The detailed explanation of these operations are given later.

The JTAG circuit of the LSI 1 receives the test data input TDI from the SCI 502. The test data output TDO of the JTAG circuit of the LSI 1 is connected to the test data input TDI of the JTAG circuit of the LSI 2. Likewise, the test data output TDO in the LSI is connected to the test data input TDI of the LSI of the next stage, and the test data output TDO of the last LSIn is connected to the test data output TDO to the SCI 502. Accordingly, the test data input TDI from the interface circuit SCI 502 is returned to the test data output TDO of the interface circuit SCI 502 through the LSI 1–LSI n, thus forming a large scan chain.

Figure 8:
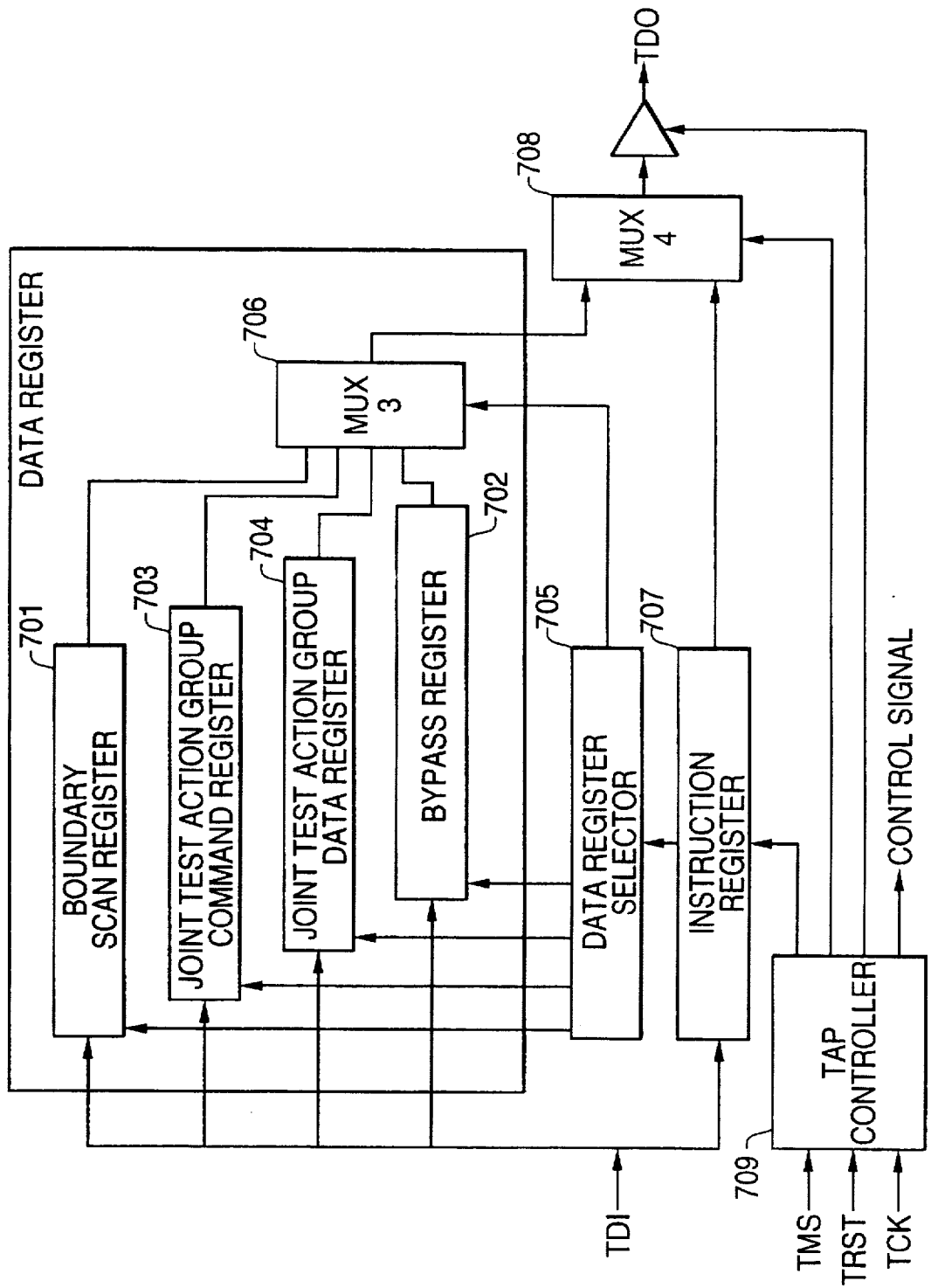
FIG. 8 shows an embodiment of a JTAG circuit according to the present invention.

FIG. 8 shows an embodiment of the JTAG circuit of the present invention. The JTAG circuit comprises a test access port (TAP), a TAP controller 709, a scannable instruction register 707, a series of scannable data registers 701–704, multiplexers 706 and 708 for selecting data output from the registers and outputting them, and a data register selector 705 for selecting a register in the data registers.

A TAP signal can be configured with a test clock input (TCK), a test mode selection input (TMS), a test data input (TDI), a test data output (TD0), and a test reset input (TRST) to initialize a test logic.

The TAP controller 709 enters data in the instruction register 707 or a data register, or shifts the data using the test mode selection input TMS and the test clock input TCK. If the instruction register 707 is selected, the input signals from the test data input TDI are sequentially shifted to the instruction register 707. When instructions are properly set, the data written to the instruction register 707 are entered in the data register selector 705, and one register in the data registers is selected.

A data register comprises a boundary scan register 701, a bypass register 702, a JTAG command register 703 (JIR) for storing a command to control a system logic circuit, and a JTAG data register 704 (JDR) for controlling the system logic circuit.

The JIR 703 comprises a shift register or a shift register and a latch circuit, and sequentially receives input data as being shifted from the test data input TDI. If a predetermined command is set in the JIR 703, then the command in the JIR 703 is transferred to the command analyzing unit 603 in a command control unit, and the command is analyzed in the command analyzing unit 603.

The JDR 704 also comprises a shift register, or a shift register and a latch circuit. If data are written to the JDR 704, then input data from the test data input TDI are sequentially shifted and entered. If predetermined data are set in the JDR 704, the data in the JDR 704 are transferred to the executing unit 604 in the command control unit, and using the data a process is performed based on the analysis result in the command analyzing unit 603. For example, data can be set in a register of a system logic circuit for performing a normal operation, a specific value can be set in a counter, and only a specific circuit can be reset.

Data can also be read from a system logic circuit performing a normal operation. For example, transferred to the JDR 504 are the data stored in the register of the system logic circuit performing a normal operation. Then, the contents of the JDR 704 is sequentially shifted, and output data from the test data output TDO are read so that the state of the system logic circuit performing a normal operation can be read. Therefore, if data are ready to be transferred to the JDR 704 from a circuit to be tested, then the state of any portion can be read.

Figure 9:
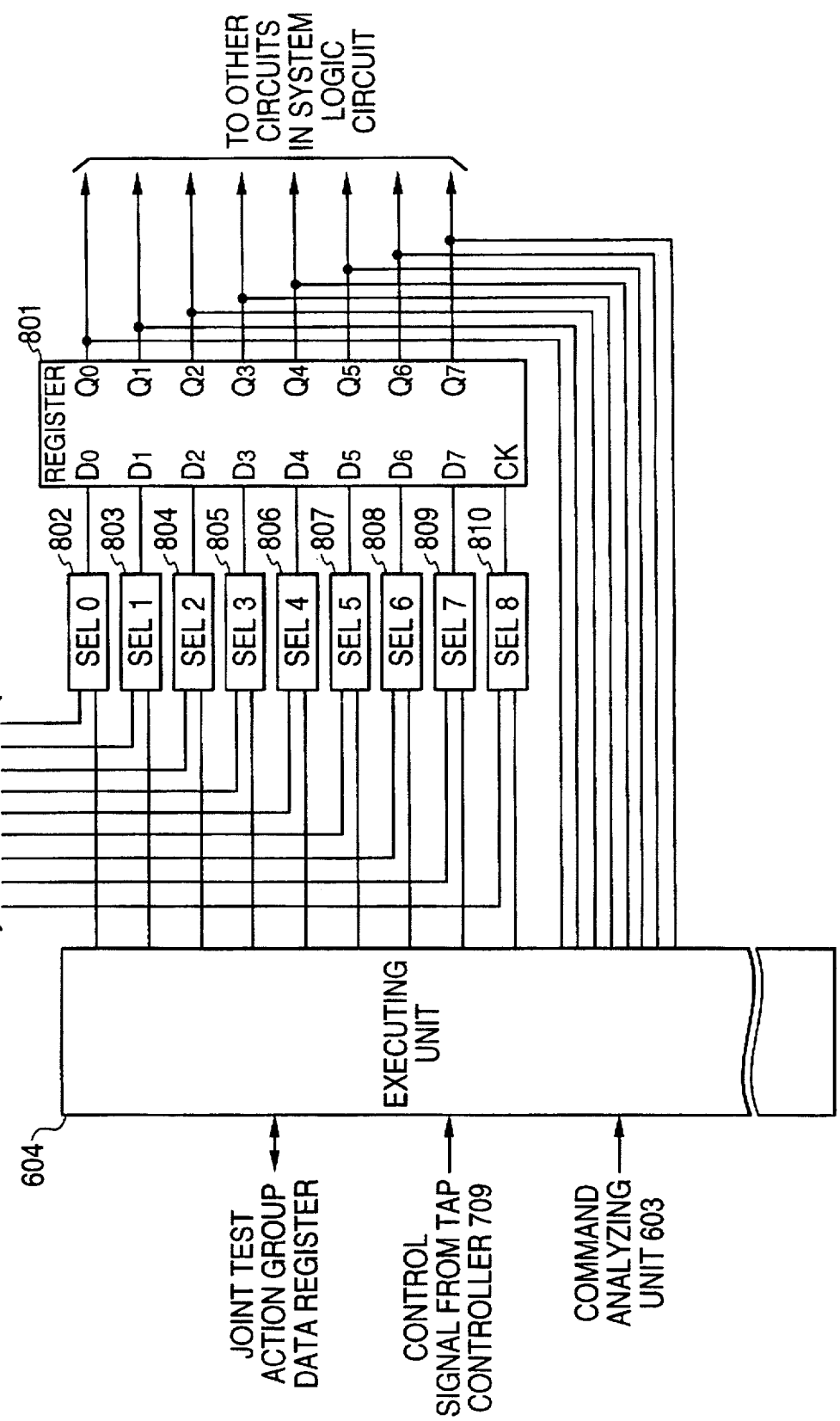
FIG. 9 shows an example of a test portion of a system logic circuit executed by an executing unit of FIG. 7 according to the present invention.

FIG. 9 shows an example of a test portion in a system logic circuit.

An 8-bit register 801 (comprising 8-bit F/F) is a circuit in a system logic circuit. Input signals D0–D7 and a CK of the register 801 are connected to other circuits in the system logic circuit. Data are to be written through a JTAG circuit to test other circuits in the system logic circuit connected to the register 801. Selectors SELs 0–8 (802–810) are circuits added to switch signals from other circuits and the executing unit 604. When normal system logic circuits are operated, signals from other circuits in the system logic circuit are selected by the selectors SELs 0–8. If a data write operation to the register 801 is analyzed by the command analyzing unit 603 when a test is conducted, then signals from the executing unit 604 are selected.

If a data write operation to the register 801 is analyzed by the command analyzing unit 603 during a test, then the contents of the JDR 704 are input to the input signals D0–D7 of the register 801 through the selectors SELs 0–7. A control signal from the TAP controller 709 is converted by the executing unit 604 into a timing signal used in writing data to the register 801 and input to the CK of the register 801, and test data are set in the register 801. Then, a predetermined test can be conducted on a circuit portion associated with the register 801 by operating the system logic circuit.

If the contents of the register 801 are read during the test, then outputs Q0–Q7 of the register 801 are output to the JDR 704 through the executing unit 604 and latched by the JDR 704 according to a control signal from the TAP controller 709. The SVP 501 reads the contents of the register 801 by reading the test data output TDO through the interface circuit SCI 502 while performing a shifting process in the JDR 704, thereby reading the contents of the register 801.

The state transition detected when a command and data are set in the JIR 703 and JDR 704 respectively is described below by referring to FIGS. 10 and 2.

Figure 1:
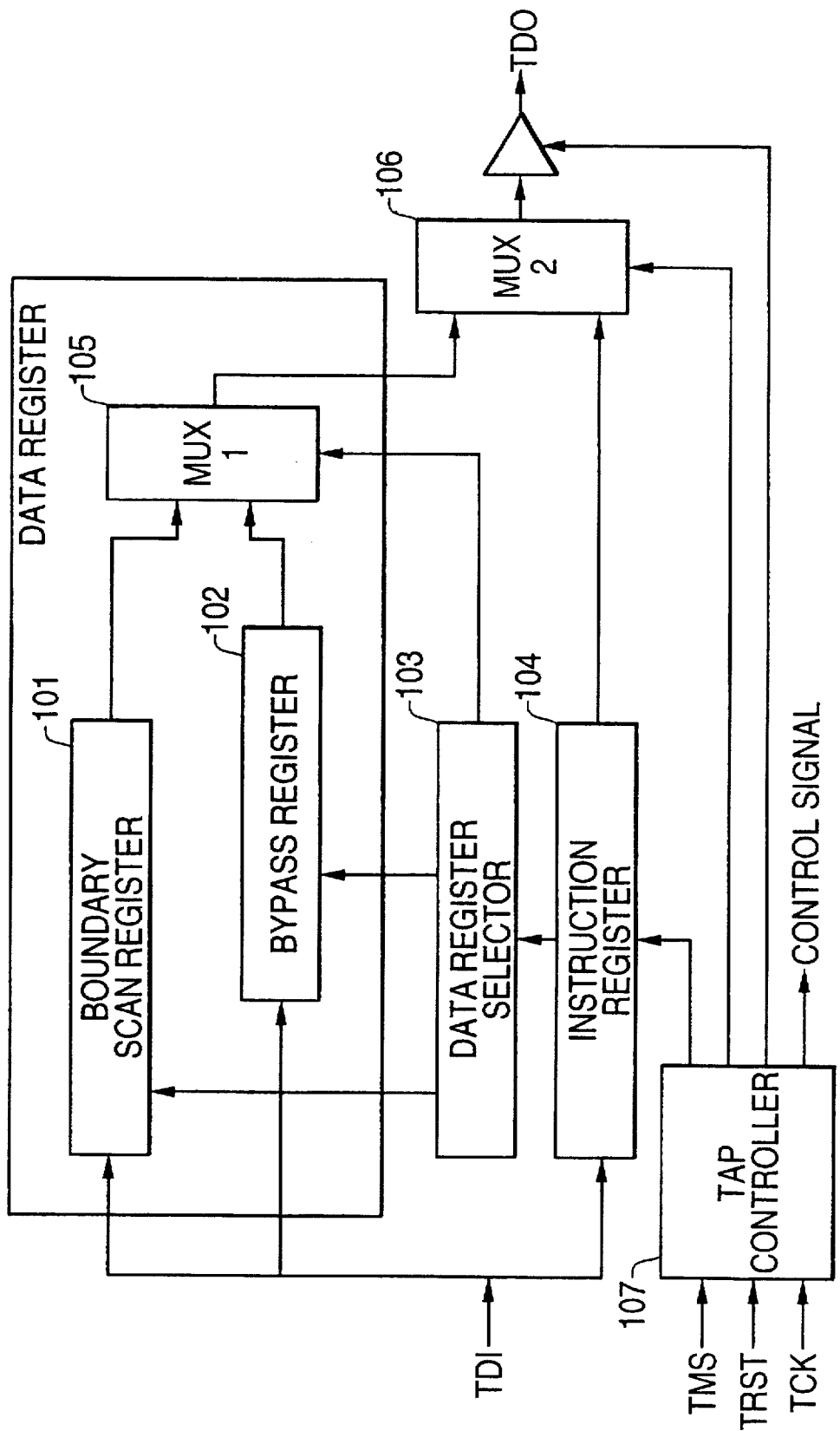
FIG. 1 shows the configuration of a conventional JTAG circuit.
Figure 2:
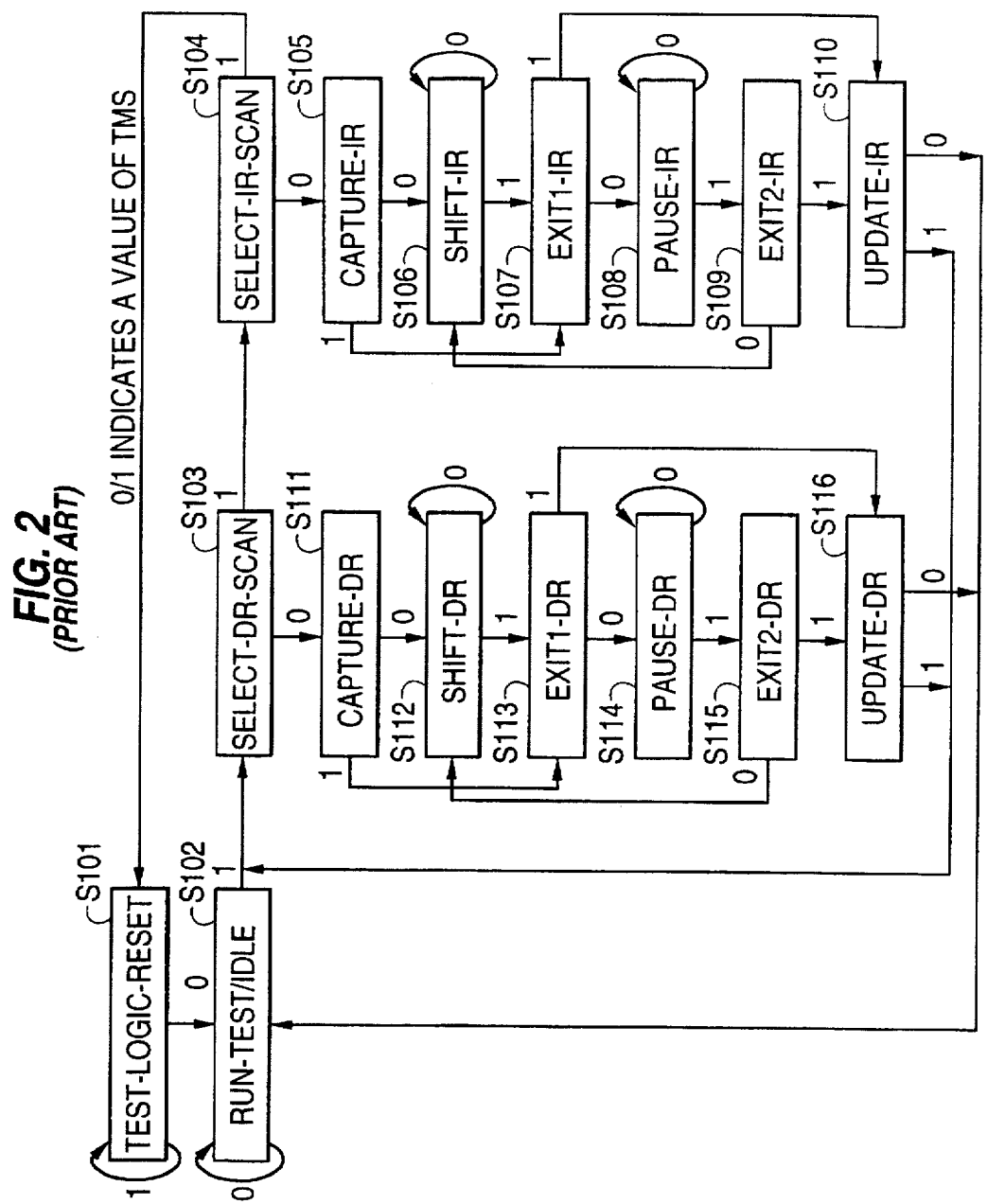
FIG. 2 shows the state transition of a test logic in a conventional device.
Figure 3:
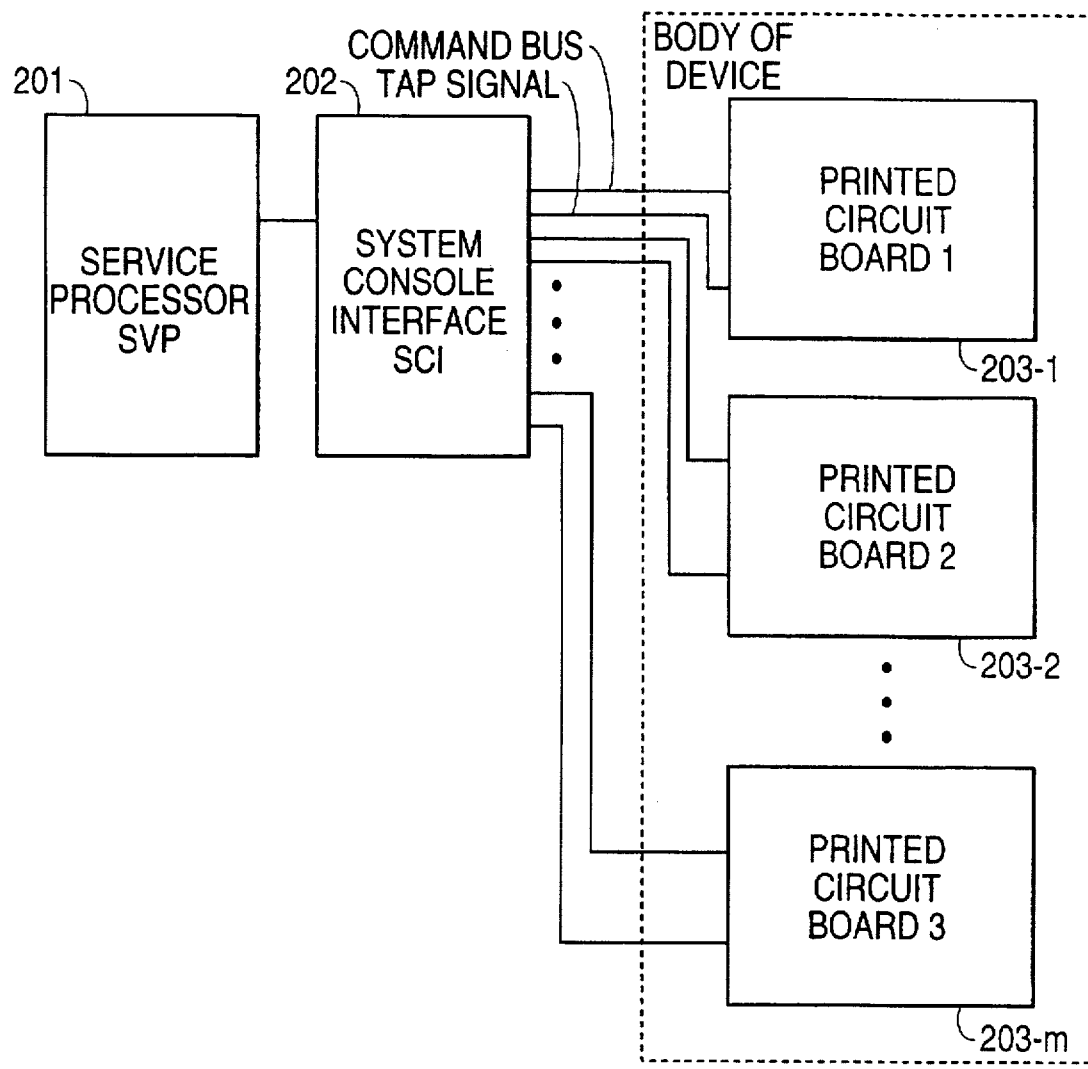
FIG. 3 shows a general configuration of a conventional device designed to test a body of a device.

FIG. 2 shows the state transition detected when data are set in the instruction register 707 and the data registers of the JTAG circuit as described in the explanation of the related arts. The state changes depending on the state of the test mode selection input TMS at the rise of the test clock TCK. The TEST-LOGIC-RESET state is entered immediately after the initialization of the TAP controller 709.

FIG. 10 shows the state transition detected when data are set in the JDR 704 after setting a command in the JIR 703. The state transition shown in FIG. 10 shows the state transition chart indicating the transitions of states in a time series. S204–S212 indicate the state transitions detected when a JIR SET instruction is set in the instruction register 707. The JIR SET instruction selects the JIR 703 in the data register, and connects the JIR 703 between the test data input TDI and the test data output TDO. First, raising the test clock input TCK by setting the test mode selection input TMS to 0 changes from the TEST-LOGIC-RESET state (S201) to the RUN-TEST/IDLE state (S202). This state is the basic state during a test, and indicates that a test state is entered from the normal state of the system logic. Hereafter, it is assumed that the state transition is made when the test mode selection input TMS is entered at the rise of the test clock input TCK.

The RUN-TEST/IDLE state (S202) is shifted to the SELECT-IR-SCAN state (S204) through the SELECT-DR-SCAN state (S203). At this time, the scan sequence of the instruction register 707 is initialized.

When the CAPTURE-IR state (S205) is entered, a fixed pattern is stored in a shift register in the instruction register 707. However, the fixed pattern is not used in this embodiment.

If the SHIFT-IR state (S206) is entered, the shift register in the instruction register 707 is connected between the test data input TDI and the test data output TDO, and data are shifted to the test data output TDO. Since the instruction register 707 is an 8-bit register, eight continuous shifting processes set an instruction in the instruction register 707. If the shifting operations are suspended, the PAUSE-IR state (S208) is entered after the EXIT1-IR state (S207). If the shifting operations are not suspended, then the UPDATE-IR state (S212) is entered when a predetermined shifting operation is completed after the EXIT1-IR state (S207).

The PAUSE-IR state (S208) is entered when, for example, a memory in a test mechanism is loaded with a new pattern.

If a shifting operation is resumed after a pause state, then the UPDATE-IR state (S212) is entered after the EXIT2-IR state (S209), the SHIFT-IR state (S210) again, the remaining shifting operations, and then the EXIT1-IR state (S211).

If the UPDATE-IR state (S212) is entered, then a new instruction obtained by the shifting operation is loaded to the instruction register 707 and latched therein. The latched instructions are output in parallel and input to the data register selector 705.

After the above described operation, a JIR set instruction is set in the instruction register 707 and the JIR 703 in the data register is selected. Then, the JIR 703 is connected between the test data input TDI and the test data output TDO.

S214–S222 indicate the state transitions detected when a command is set in the selected JIR 703. S214–S222 indicate the same states detected when an instruction is set in the instruction register 507 in S204–S212. Detailed explanation of states S214–S222 is omitted here because only differences are that data are input from the test data input TDI in the JIR 703 and that the shifting operations are repeated for each stage of the shift registers.

When the UPDATE-DR state (S222) is entered, then a command is set in the JIR 703 and transmitted to the command analyzing unit 603 in the command control unit for analyzing the command. If the command is data read operation from a normal system logic circuit, then the state is transmitted to the JDR 704 in the data register. On the other hand, if a state is to be set in a normal system logic circuit, then the command is executed after data are set in the JDR 704 by the shifting operation explained below.

S225–S233 indicate the state transitions detected when a JDR SET instruction is set in the instruction register 707. The JDR SET instruction selects the JDR 704 in the data register and connects the JDR 704 between the test data input TDI and the test data output TDC. Detailed explanation is omitted here because only difference between the states in S225–S233 and in S204–S212 is that a JIR SET is set in the instruction register in S225–S233.

When the UPDATE-IR state (S233) is entered, a JDR SET instruction is loaded to the instruction register 707 and latched therein. The latched instructions are output in parallel and input to the data register selector 705. Then, the JDR 704 is selected in the data register and connected between the test data input TDI and the test data output TDO.

S235–S243 indicate the state transitions detected when data are set by a shifting operation performed by the JDR 704 or data are transferred to the JDR 704 from a system logic circuit and then read by a shifting operation. Described below is the state transition detected when data are set in the JDR 704 and then written to a predetermined circuit in the system logic circuit.

If the CAPTURE-DR state (S236) is entered after the SELECT-DR-SCAN state (S235), then data are loaded in parallel in the JDR 704. However, if data are loaded in the selected JDR 704 through a shifting operation, then the loading operation is not significant at all.

If the SHIFT-DR state (S237) is entered, the JDR 704 is connected between the test data input TDI and the test data output TDO. A piece of data are shifted toward the test data output TDO each time the test clock input TCK rises, and the shifting operation is repeatedly performed for each stage of the shift registers in the JDR 704.

If the shifting operation should be suspended, it can be suspended by entering the PAUSE-DR state (S239) after the EXIT-DR state (S238) and other processes are performed during the suspension of the shifting operation. If the shifting operation is resumed, it is operated by entering the SHIFT-DR STATE (S241) again after the EXIT2-DR state (S240).

After the completion of the shifting operation, the UPDATE-DR state (S243) is entered after the EXIT1DR state. When the UPDATE-DR state is entered, the data shifted to the JDR 704 are transferred to the executing unit 604. In the command control unit, the data transferred from the JDR 704 are written to a predetermined circuit of the system logic circuit according to the analysis result of a command.

Then, described below are the state in the system logic circuit transferred to the JDR 704 and the state transferred and read.

If the CAPTURE-DR state (S236) is entered after the SELECT-DR-SCAN state (S235), then data are loaded in parallel in the JDR 704. At this time, the loaded data indicate the state of a signal of a circuit, for example, a register in the system logic circuit specified by a command.

When the SHIFT-DR state (S237) is entered, the JDR 704 is connected between the test data input TDI and the test data output TDO, and data are shifted toward the test data output TDO piece by piece each time the test clock input TCK rises. Thus, the shifting operation is performed for each stage of the shift registers. Accordingly, the state of the system logic circuit can be recognized if the test data output TDO is read each time data are shifted. The detailed explanation of the subsequent state transitions S238–S243 is omitted here because they are the same as the states detected when data are set by shifting data to the JDR 704.

If a series of processes are completed, the TEST-LOGIC-RESET state (S247) is entered after the SELECT-DR-SCAN state (S245) and the SELECT-IR-SCAN state (S246), thereby enabling the system logic to be normally performed.

Using a JTAG circuit, as described above, data can be set in a circuit such as a register in a system logic circuit, etc. which is in a test state, or data can be read from a circuit such as a register in a system logic circuit, etc. However, the present invention is not limited to the application in a test state, but can be utilized in the above described processes using the JTAG circuit in normal operations.

It is obvious that the JIR 703 for storing a command to control the system logic circuit and the JDR 704 for storing data used to control the system logic circuit can be shift registers or latch circuits comprising any bits.

If a command requires no data, it can be executed using the JIR 703 only.

According to the present invention, the SCI can be connected to each printed circuit board in the system testing device with five TAP signals only, thereby considerably reducing the number of connection lines.

Conventionally required in the SCI are the JTAG scan interfaces for controlling a JTAG circuit and the command interfaces for issuing a command. Among them, the command interfaces are not required according to the present invention, thus reducing the scale of the SCI circuit.

What is claimed is:

1. A device for testing a system including an integrated circuit disposed on a board, connected to an interface to receive via a bus a scan test signal, the system further including test logic composing the device and system logic for performing normal operation of the system, the device being disposed on the board, and comprising:

storing means for, storing a command and data used to test the system logic;

controlling means for selectively inputting/outputting the command and data to said storing means; and command control means for receiving the command and data from said storing means, analyzing the command, transferring the command and data to the system logic of the system to be tested in accordance with a result of the analysis, and receiving data from the system logic to read out a state of the system logic as a result of a test.

2. A device for testing a system including an integrated circuit disposed on a board, the system including a test logic circuit composing the device and a system logic circuit for performing normal operation of the integrated circuit, the device disposed on the board, comprising:

a Joint Test Action Group (JTAG) circuit which comprises (a) a boundary scan register for capturing and storing a signal appearing at each terminal of the integrated circuit, (b) a bypass register for bypassing the signal to another integrated circuit, (c) JTAG instruction storage means for storing a command to control a system logic circuit, (d) JTAG data storage means for storing data used in controlling the system logic circuit, as data registers, (e) data register selecting means for selecting one of the data registers, (f) first switching means for switching each output from the data registers according to an instruction of the data register selecting means, (g) an instruction register latching the instruction and outputting the instruction to the data register selecting means, and (h) a test access port controller controlling the data registers, the data register selecting means, the first switching means, and the instruction register;

command analyzing means for analyzing contents of the command output from the JTAG instruction storage means; and executing means for sending the command and data to the system logic circuit and receiving data from the system logic circuit as a result of a test of the system, in accordance with an analysis result obtained by the command analyzing means.

3. The device according to claim 2, wherein said JTAG instruction storage means shifts and latches the command.

4. The device according to claim 2, wherein the command is transferred from said JTAG instruction storage means to said command analyzing means when a state of test logic in said test access port controller changes to a command update state.

5. The device according to claim 2, wherein said executing means transfers data from a register in said system logic circuit to said JTAG data storage means.

6. The device according to claim 5, wherein if the data are transferred from said register in the system logic circuit, said JTAG data storage means first latches the data after a transfer, and then shifts the data.

7. The device according to claim 5, wherein the data are transferred from said register in the system logic circuit to said JTAG data storage means when a state of a test logic in said test access port controller changes to a data update state.

8. The device according to claim 2, wherein said executing means transfers the data from said JTAG data storage means to said register in the system logic circuit.

9. The device according to claim 8, wherein if the data are transferred to said register in the system logic circuit, said JTAG data storage means transfers the data after shifting and latching the data.

10. The device according to claim 8, wherein the data are transferred from said JTAG data storage means to said register in the system logic circuit when a state of a test logic in said test access port controller changes to a data update state.

11. A method for testing a system including an integrated circuit disposed on a board using a Joint Test Action Group (JTAG) circuit, the system including a system logic circuit to perform normal operation of the system and a test logic circuit to test the system logic circuit of the system, the method comprising:

providing in a data register of the JTAG circuit a register for storing a command and data for use in controlling the system logic circuit;

providing on the board a command control unit for analyzing the command and receiving a result of a test of the system logic circuit;

receiving a test access port signal from an interface and selectively storing the command and the data in said register; and controlling a test of the system based on the stored command and the stored data.

12. A method for resting a system including an integrated circuit disposed on a board using a Joint Test Action Group (JTAG) circuit, the system including a system logic circuit to perform normal operation of the system and a test logic circuit to test the system logic circuit of the system, the method comprising:

providing in a data register of the JTAG circuit a register for storing a command and data for use in controlling the system logic circuit;

providing on the board a command control unit for analyzing the command and receiving a result of a test of the system logic circuit;

receiving a test access port signal from an interface and selectively storing the command and data in said register; and analyzing the command and writing the stored data in a predetermined system logic circuit if an analysis result indicates a command to write data in the system logic circuit.

13. A method for testing a system including an integrated circuit disposed on a board using a Joint Test Action Group (JTAG) circuit, the system including a system logic circuit to perform normal operation of the system and a test logic circuit to test the system logic circuit of the system, the method comprising:

providing in a data register of the JTAG circuit a register for storing a first command and data for use in controlling the system logic circuit;

providing on the board a command control unit for analyzing the first command and receiving a result of a test of the system logic circuit;

receiving a test access port signal from an interface and selectively storing the first command and data in said register analyzing the first command, and, after reading data from a predetermined system logic circuit, storing the data in the register if an analysis result indicates a second command to read data from the system logic circuit; and outputting the data stored in the register to the test access port signal.

* * * * *